United States Patent

Umehara et al.

[11] Patent Number: 5,948,592
[45] Date of Patent: Sep. 7, 1999

[54] WATER-SOLUBLE PHOTORESIST COMPOSITION

[75] Inventors: Hiroshi Umehara, Tokorozawa; Takateru Asano, Tokyo, both of Japan

[73] Assignee: Fuji Chemicals Industrial Co., Ltd., Tokyo, Japan

[21] Appl. No.: 09/111,194

[22] Filed: Jul. 7, 1998

[30] Foreign Application Priority Data

Oct. 20, 1997 [JP] Japan ................................ 9-287383

[51] Int. Cl.$^6$ .............................. G03F 7/008; G03F 7/04
[52] U.S. Cl. ................... 430/270.1; 430/197; 430/289.1
[58] Field of Search .......................... 430/270.1, 197, 430/289.1

[56] References Cited

U.S. PATENT DOCUMENTS

| 2,692,826 | 10/1954 | Neugebauer et al. | 95/5.4 |
| 4,211,563 | 7/1980 | Goldman | 430/286 |

FOREIGN PATENT DOCUMENTS

| 54-12331 | 1/1979 | Japan . |
| 55-23163 | 2/1980 | Japan . |
| 56-20541 | 2/1981 | Japan . |
| 57-6098 | 1/1982 | Japan . |
| 88-074856 | 2/1988 | Japan . |
| 41-7100 | 4/1992 | Japan . |
| 07207464 | 8/1995 | Japan . |
| 95-356408 | 9/1995 | Japan . |

OTHER PUBLICATIONS

Sawada et al. 124:71615 File HCA of STN Database Service, Chemical Abstracts, American Chemical Society, 1997, English Abstract of JP 07 207464.

Sawada et al. Accession No. 95–309549/40, On–line Derwent Abstract, File WPAT, English Abstract of JP 07207464, Published Aug. 8, 1995.

Sawada et al. Accession No. 95–207464, File JAPIO, English abstract of JP 07207464 published Aug. 8, 1995.

*Primary Examiner*—Janet Baxter
*Assistant Examiner*—Sin J. Lee
*Attorney, Agent, or Firm*—Faegre & Benson LLP

[57] ABSTRACT

A water-soluble photoresist composition is provided which comprises a water-soluble photosensitive composition containing a casein component and a water-soluble photosensitive agent and at least one calcium salt of an organic acid. The photoresist composition has excellent sensitivity, resolution, and etching resistance and can be used for the production of highly refined electronic components such as shadow masks, lead frame, etc.

3 Claims, No Drawings

WATER-SOLUBLE PHOTORESIST COMPOSITION

FIELD OF THE INVENTION

The present invention relates to a water-soluble photoresist composition used for the process utilizing photolithography in the production of shadow mask of the color cathode-ray tube, IC lead frame, mesh for Vacuum Fluorescent Display, color filter, black matrix, etc., which are being made fine, particularly to a water-soluble photoresist composition having improved etching resistance as well as good sensitivity and resolution.

BACKGROUND OF THE INVENTION

The shadow mask used for the color cathode-ray tube is usually produced by the following process. Namely, decarbonized aluminum killed steel (hereinafter referred to as AK material) having a plate thickness of 25 $\mu$m to 0.3 mm or Inver-type iron alloy (hereinafter referred to as Inver material) containing 36% of nickel having small thermal expansion coefficient is used as a substrate. Their surfaces are refined by degreasing and washing with water, and coated with a water-soluble photoresist followed by drying to make a film. Then, the mask pattern having a desired image at the position corresponding to the electron beam passing pores is brought into contact with the above film to effect exposure to ultraviolet ray. After the steps of development, hardening and heat treatment, a corrosion resistant film (resist film) with a desired pattern is formed on the substrate. After the metal part where the resist film has been removed by the development is subjected to etching using an etching solution such as ferric chloride or the like to form a number of electron beam passing pores, the remaining resist film is removed using a warm alkaline solution (for example, a 10 to 20% aqueous solution of sodium hydroxide), thereby obtaining the shadow mask. Electronic components such as IC lead frame, mesh for Vacuum Fluorescent Display, printed wiring board, and the like are also produced in the similar manner as in the production of the shadow mask using as a substrate copper, copper alloy, iron materials, 42 Nickel—iron alloy (hereinafter referred to as 42 Ni—Fe alloy, or simply 42 alloy); stainless steel, and the like.

Photoresists that are used for etching (hereinafter referred to as resists) are water-soluble negative working resists having such advantages that they are inexpensive, are not inflammable, and can be treated in aqueous solutions over the whole steps. The photoresists are prepared by adding ammonium dichromate to an aqueous solution of water-soluble polymer such as casein, polyvinyl alcohol, fish glue, and the like in an amount of 3 to 15% based on the water-soluble polymer, thereby achieving photosensitivity.

For these resists for etching, dichromate such as ammonium dichromate is used as a photosensitive agent and chromic anhydride is used as a hardener. Since these hexavalent chromium compounds are harmful, discharge of waste water containing them is strictly regulated.

The water-soluble photoresists without using hexavalent chromium (hereinafter referred to as no chromium etching resist) have been reported. They include the combination of fish glue and ferric salt, polyvinyl alcohol (hereinafter referred to as PVA) and diazo resin (Japanese Patent Publication No. Sho 56-20541 and Japanese Patent Publication No. Sho 57-6098), a water-soluble photosensitive resin containing several molar percent of N-methyl-γ-(p-formylstyryl)pyridinium sulfate (Japanese Patent Application Laid-open No. Sho 55-23163), casein and water-soluble azide compound (Japanese Patent Publication No. Sho 41-7100 and U.S. Pat. No. 2,692,826), water-soluble acrylic resin having ethylenic unsaturated bonding at its side chain, anthraquinone sulfonate, and water-soluble azide compound (Japanese Patent Publication No. Sho 54-12331), and the like. However, these are not still satisfactory in view of sensitivity, resolution, and etching resistance.

As electronic components such as shadow masks and lead frames are produced in a large quantity and are highly refined, it has been desired to further improve sensitivity, resolution, and etching resistance of the resists. Especially, casein-based no chromium etching resist having practical sensitivity, resolution, and etching resistance has been strongly demanded.

SUMMARY OF THE INVENTION

As a result of intensive investigation in order to solve the above problems, the present inventors have found that a water-soluble photoresist composition that can solve the above problems can be obtained by adding at least one calcium salt of an organic acid to a water-soluble photosensitive composition containing a casein component and a water-soluble photosensitive agent. Based on this finding, the present invention was completed.

DETAILED DESCRIPTION OF THE INVENTION

The calcium salt of an organic acid to be used in the present invention is water-soluble or a compound that can be dissolved or dispersed in a water-soluble photosensitive composition and that does not interfere its photosensitivity. Specific examples thereof include calcium aspartate, calcium acetate, calcium formate, calcium glycerophosphate, calcium gluconate, calcium glycolate, calcium lactate, calcium pantothenate, calsium lactobionate, calcium glutamate, and the like. A preferable calcium salt of an organic acid has a molecular weight of not more than 1000.

According to the present invention, the calcium salt of an organic acid (hereinafter referred to as the calcium salt are added in the form of being dissolved in water or directly added to an aqueous solution of a water-soluble photosensitive composition containing casein and a photosensitive agent. However, the method of addition of the calcium salt is not limited to the above.

Metal substrate such as copper, iron, and their alloy, anodized aluminum, silicon, or the like, or non-metallic substrate such as glass, ceramics, or plastic film made of polyethylene terephthalate or the like are coated with the photoresist compositions containing the calcium salt, then dried to form a resist film having a film thickness of 0.1 to 10 $\mu$m, which is not particularly restricted.

The formed photoresist film is subjected to an imagewise exposure, developed using an aqueous developing solution, and if necessary, hardened to form relief patterns. Though varying depending on the kind of the water-soluble photosensitive agent, the addition of the calcium salt improves sensitivity and resolution of the resists. One of examples of the hardening treatment comprises thermal hardening of the relief pattern at 150 to 300° C. to give a resist coating excellent in etching resistance.

Though the mechanism for exhibiting these effects obtained by adding the calcium salt has not been elucidated yet, it is assumed that a kind of bonding via $Ca^{2+}$ between proteins in casein micelle is formed by adding the calcium salt to more closely contact the resist with the substrate after the photochemical reaction, thereby improving photosensitivity, resolution, and etching resistance.

The calcium salt may be used alone or two or more thereof in combination. The content of the calcium salt ranges from 0.1 to 20 wt %, preferably 1.0 to 15 wt %, based on the weight of casein contained in the water-soluble photosensitive composition. If the amount of the calcium salt is less than 0.1 wt %, a photosensitivity-improving effect is weak. If the amount of the calcium salt is more than 20 wt %, the particle size of casein micelle becomes large, which affects the stability of the photosensitive composition.

The casein component to be used in the water-soluble photosensitive composition of the present invention may be acid casein such as lactic casein, hydrochloric casein and sulfuric casein, sodium caseinate, calcium caseinate, and the like. Particularly, in view of stability, it is preferable to use an aqueous casein solution prepared by dissolving acid. casein in water containing amines such as ammonia, triethylamine, or the like or inorganic alkali agent such as borax; sodium carbonate, sodium hydroxide, or the like. Moreover, the casein component may be incorporated into a commercially available water-soluble photosensitive composition, such as that described by Japanese Patent Publication No. Sho 60-46420 (and U.S. patent application Ser. No. 772,996) can be used. These are marketed as, for example, trade names, "FR-15", "FR-16", and "FR-17" (all of these manufactured by Fuji Chemicals Industrial Co., LTD.), or "MR-SLG", "MR-SMG", and "MR-SG" (all of these manufactured by The Inctec Inc.).

The water-soluble photosensitive agent used in the present invention is a photosensitive agent to be dissolved in the above-described aqueous solution of the casein component, including, for example, dichromate such as ammonium dichromate, water-soluble azide compounds, onium salts (e.g., 2-naphthoyl-methyltetramethylenesulfoniumtrifluoromethanesulfonate), and the like. Two or more of the photosensitive agents may be used taking into account the solubility of the photosensitive agents in water and the spectrum of the light source used. The amount of the water-soluble photosensitive agent to be used within the water-soluble photosensitive composition is conventionally known by those of skill in the art. Generally, the amount of the water-soluble photosensitive agent will range from 1 to 10 parts by weight per 100 parts by weight of the casein component.

If a water-soluble azide compound is to be used as the water-soluble photosensitive agent, the photosensitive composition of the present invention may further optionally comprise a bisazide compound or, compound containing three or more azide groups. When utilized, such a compound acts as a photo-crosslinking agent for the water-soluble azide compound. Examples of such a photo-crosslinking agent include high molecular water-soluble azide compound such as 4,4'-diazidostilbene-2,2'-disulfonate, 4,4'-diazidobenzalacetone-2,2'-disulfonate, 2,5-(4,4'-diazidobenzal)cyclohexanone-2,2'-disulfonate, maleic acid-sodium vinylmonoazidobenzylideneacetophenone-sulfonate copolymer or the like. They are usually used as sodium salt or potassium salt, or salt of tetramethylammonium hydroxide.

As the water-soluble photosensitive agent, high molecular ones can achieve high sensitivity as compared. with low molecular ones. For example, the sensitivity of the water-soluble photosensitive composition prepared by adding dimethylacrylamide-vinylazidobenzylideneacetophenonesulfonate copolymer (molar ratio, 2:1, weight-average molecular weight, 20000) is more than three times higher than that prepared by adding sodium 4,4'-diazidostilbene-2,2'-disulfonate.

The photoresist composition of the present invention is prepared by adding the calcium salts to the water-soluble photosensitive composition containing the casein component and the water-soluble photosensitive agent. If necessary, the photoresist composition may further contain a preservative, an antifungal agent, a coloring material, a plasticizer, a crosslinking agent, a sensitizer (e.g., thioxanthone-4-sulfonate, etc.), and an adhesion-promoting agent. In the case of using a metal substrate having poor adhesive property to the water-soluble resist, it is possible to add one or two or more of adhesion-promoting agents selected from γ-aminopropyltrimethoxysilane, N-(β-aminoethyl)γ-propylmethyl-dimethoxysilane, N-(β-aminoethyl)γ-aminopropyltrimethoxysilane, and the like.

The substrate is coated with the water-soluble photoresist composition of the present invention to a film thickness of about 0.1 to 10 μm by the conventionally used method such as whirling coating method, dip coating method, flow coating method, and the like, followed by drying. After exposure for image, unexposed parts are removed by dissolving (water development) to form resist patterns. The thus-formed resist patterns are hardened by heating to improve the resist properties. The substrate is then treated with an etching solution.

The water-soluble photoresist composition of the present invention shows improved sensitivity, resolution, and etching resistance by adding the calcium salt to the water-soluble photosensitive composition containing the casein component and the water-soluble photosensitive agent. Therefore, the water-soluble photoresist composition can suitably be used for the production of shadow mask of the cathode-ray tube, IC lead frame, mesh for Vacuum Fluorescent Display, printed wiring board, color filter, black matrix, etc., which are being made fine.

Since the photoresist composition of the present invention is water-soluble, it has such advantages that preparation of the. photoresist composition, formation of the photoresist film, development, etching, and the like can be done in aqueous solutions. Further, according to the present invention, without using hexavalent chromium that is a harmful substance, a non-chromium containing etching resist composition which has good adhesiveness to metal materials and is practically usable can be obtained. Thus, it is advantageous in safety during operation and in view of environmental hygiene.

The following Examples and Comparative Examples are given to illustrate the present invention in more detail, but are not to be construed to limit the scope of the present invention.

EXAMPLE 1

10 g of a 10% ammonium dichromate aqueous solution was added to 100 g of an aqueous casein solution ([FR-17] manufactured by Fuji Chemicals Industrial Co., LTD. containing 12.01 wt % of casein) to give a water-soluble photoresist solution. After dissolving 0.6 g of calcium acetate in the photoresist solution, the mixture was allowed to stand in the dark for 2 hours and subjected to defoaming treatment to prepare an aqueous solution of the water-soluble photoresist composition of the present invention.

42 alloy having a thickness of 0.3 mm was immersed in a 3% aqueous solution of Jusco Clean No. 5 (aqueous alkali.

solution manufactured by Nippon Hyomen Kagaku Kabushiki Kaisha) for 2 minutes for degreasing. The alloy was then washed with water and dried to serve as a substrate. The substrate was coated with the resist composition as prepared above to a thickness of 6 μm using whirler. The coated substrate was dried (prebaked) in a hot-air thermostatic drying chamber at 60° C. for 10 minutes.

The thus-formed photoresist film was exposed to an ultraviolet ray of not shorter than 300 nm at the dose of 400 mJ/cm$^2$ using a superhigh pressure mercury vapor lamp, with bringing it into close contact under vacuum with a resolution chart manufactured by Toppan Printing Co., Ltd. and Kodak Photographic Step Tablet No. 2 (hereinafter referred to as gray scale). Then, this was immersed in tap water of 25° C. for 45 seconds. Unexposed parts were dissolved, washed with water, and dried with a dryer. The resulting photoresist coating film was postbaked in a hot-air thermostatic drying chamber at 200° C. for 10 minutes. This photoresist showed so high sensitivity that the layer remained up to 7.5 steps (hereinafter expressed as gray scale sensitivity of 7.5). As to resolution, there was no fringe of the remaining film due to tail drawing of the unexposed parts and the resist pattern showed the line and space resolution of 10 μm (hereinafter referred to as 10 μm L/S). The 42 alloy plate having this resist pattern was immersed in a ferric chloride solution of 45° Be' at 70° C. for 20 minutes, and the surface of the resist film coating was observed. As a result, no swelling or peeling of the film was observed, which revealed that it had sufficient etching resistance. The results are shown in Table 1.

COMPARATIVE EXAMPLE 1

A photoresist pattern was produced and its etching resistance was examined in the same manner as in Example 1 except for using the water-soluble resist composition (Comparative Example 1) which did not contain calcium acetate used in Example 1. The results are shown in Table 1.

EXAMPLES 2 AND 3

A photoresist pattern was produced and its etching resistance was examined in the same manner as in Example 1 except for using the water-soluble resist composition which contained calcium gluconate or calcium lactobionate each in an equivalent amount in place of calcium acetate used in Example 1. The results are shown in Table 1.

As can be seen from the results shown in Table 1, the water-soluble resist compositions of the present invention, had high sensitivity and good resolution. Etching resistance of the compositions containing the calcium salt was quite well compared with that of the composition containing no calcium salt.

TABLE 1

| | Kind of additives | Sensi-tivity (step) | Resolution of L/S (μm) | Etching resistance | Appearance of resist solution |
|---|---|---|---|---|---|
| Ex. 1 | calcium acetate | 7.5 | 10 | good | turbid |
| Ex. 2 | calcium gluconate | 5.0 | 10 | good | same as Comparative Example 1 |
| Ex. 3 | lacto-bionic acid calcium | 5.0 | 10 | good | same as Comparative Example 1 |

TABLE 1-continued

| | Kind of additives | Sensi-tivity (step) | Resolution of L/S (μm) | Etching resistance | Appearance of resist solution |
|---|---|---|---|---|---|
| | salt | | | | |
| Com. Ex. 1 | none | 4.5 | 10 to 15 | good | whitish and transparent solution |

(Ex. means Example and Com. Ex. means Comparative Example.)
Note:
The appearance of the Photoresist solution shown in Table 1 showed preceeding states that before the photosensitive agent was added to the casein solution containing the calcium salt.

EXAMPLE 4

In 100 g of an aqueous casein solution ([FR-17] manufactured by Fuji Chemicals Industrial Co., LTD.) was dissolved 0.5 g of calcium glycolate, and then 10 g of purified water and 0.36 g of sodium 4,4'-diazidostilbene-2,2'-disulfonate as a photosensitive agent. The solution was filtrated and defoamed to obtain an aqueous solution of the water-soluble photoresist composition of the present invention.

The 42 alloy plate which had been subjected to the degreasing treatment in the same manner as in Example 1 was coated with this solution using a whirler. The thickness of this formed film was 6 μm. The resulting plate was dried in a hot-air thermostatic drying chamber at 80° C. for 10 minutes.

The thus-formed photoresist film was exposed to an ultraviolet ray at the dose of 400 mJ/cm$^2$ using a superhigh pressure mercury vapor lamp, with bringing it into close contact with the resolution chart and the gray scale. Then, this was immersed in tap water of 25° C. for 30 seconds. Unexposed parts were dissolved and washed with water. After draining water, it was dried with a dryer. The resulting photoresist coating film was hardened by heating at 250° C. for 10 minutes.

The gray scale sensitivity of this photoresist composition was as high as 5.5 step, which compared quite well with that in the case of a photosensitive composition containing a dichromate salt. With respect to resolution, 15 μm of L/S on the resolution chart was resolved without any remaining film at the unexposed parts.

Even after the 42 alloy plate having this resist pattern was immersed in a ferric chloride solution of 45° Be' at 70° C. for 20 minutes and washed with water, the resist coating film was completely durable.

To examine dark reaction of this photoresist composition, the 42 alloy plate coated with the resist was allowed to stand as it is, and, after exposure, was also allowed to stand as it is. As a result, almost no change was observed in sensitivity after 10 days or more.

COMPARATIVE EXAMPLE 2

A resist solution was prepared in the same manner as in Example 4 except for using the water-soluble resist composition which did not contain calcium glycolate (Comparative Example 2) used in the composition of Example 4 (no chromium etching resist composition) and examined its sensitivity, resolution, and etching resistance. The results are shown in Table 2. The sensitivity was low due to no existence of the calcium salt since the surface of the resist pattern was swelled, even a line of 50 μm width meandered.

With respect to etching resistance, the film was peeled off even at 70° C. for 10 minutes.

EXAMPLES 5 to 12

A photoresist solution was prepared in the same manner as in Example 4 except for using the water-soluble resist composition which contained respectively calcium gluconate, calcium acetate, calcium L-aspartate, calcium glycerophosphate, calcium lactate, calcium formate, calcium glutamate, or calcium pantothenate each in an equivalent amount in place of calcium glycolate used in Example 4. The sensitivity, resolution and etching resistance were examined in the same manner as in Example 4. The results are shown in Table 2 as well as the results of Example 4 and Comparative Example 2.

The water-soluble resist composition containing the compound of the present invention had high sensitivity and the resist pattern corresponding to 15 to 20 μm L/S was resolved. It was also found that etching resistance was improved to the practical level.

TABLE 2

|  | Kind of additives | Sensitivity (step) | Resolution (μmm) | Etching resistance immersed at 70° C. for 20 minutes |
|---|---|---|---|---|
| Ex. 4 | calcium glycolate | 5.5 | 15 | ⊚ |
| Ex. 5 | calcium gluconate | 3.5 | 20 | ○ |
| Ex. 6 | calcium acetate | 4.5 | 15 | ⊚ |
| Ex. 7 | calcium L-aspartate | 4.0 | 15 | ⊚ |
| Ex. 8 | calcium glycerophosphate | 3.5 | 20 | ○ |
| Ex. 9 | calcium lactate | 3.5 | 20 | ○ |

TABLE 2-continued

|  | Kind of additives | Sensitivity (step) | Resolution (μmm) | Etching resistance immersed at 70° C. for 20 minutes |
|---|---|---|---|---|
| Ex. 10 | calcium formate | 3.5 | 20 | ○ |
| Ex. 11 | calcium L-glutamate | 4.5 | 15 | ⊚ |
| Ex. 12 | calcium pantothenate | 3.0 | 20 | ○ |
| Com. Ex. 2 | none | 1.5 | surface swelled | x |

(Ex. means Example and Com. Ex. means Comparative Example.)

Note:
The symbols for etching resistance shown in Table 2 had the following meanings:
⊚: The surface of the resist film was not affected by ferric chloride solution at all.
○: The color of the surface of the resist film slightly changed by a ferric chloride solution
x: The resist film was peeled of f in a ferric chloride solution

What is claimed is:

1. A water-soluble photoresist composition comprising a water-soluble photosensitive composition containing a casein component, a water-soluble photosensitive agent, and at least one calcium salt of an organic acid.

2. The water-soluble photoresist composition of claim 1, wherein said calcium salt of an organic acid is contained in an amount of 0.1 to 20 parts by weight based on 100 parts by weight of the casein component.

3. The water-soluble photoresist composition of claim 1, wherein said calcium salt of an organic acid is calcium aspartate, calcium formate, calcium acetate, calcium glycerophosphate, calcium gluconate, calcium glycolate, calcium lactate, calcium pantothenate, calcium lactobionate or calcium glutamate.

\* \* \* \* \*